Figure 1:
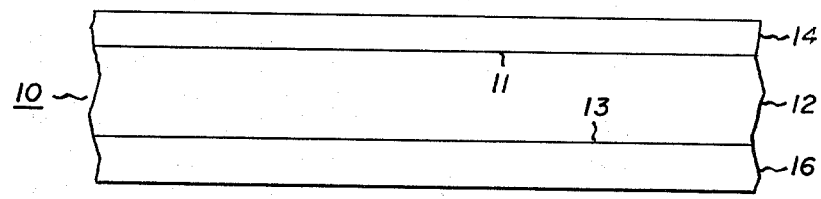

United States Patent [19]
Tefft et al.

[11] 4,325,182
[45] Apr. 20, 1982

[54] FAST ISOLATION DIFFUSION

[75] Inventors: Edward G. Tefft, Auburn; Bernard R. Tuft, Scipio Center, both of N.Y.

[73] Assignee: General Electric Company, Syracuse, N.Y.

[21] Appl. No.: 180,832

[22] Filed: Aug. 25, 1980

[51] Int. Cl.³ .................. H01L 21/263; H01L 21/302
[52] U.S. Cl. .................................. 29/583; 29/576 B; 29/576 W; 148/1.5; 148/187; 156/628; 156/643; 156/622
[58] Field of Search ............... 29/583, 576 B, 576 W; 148/1.5, 187; 156/662, 628, 643

[56] References Cited
U.S. PATENT DOCUMENTS

| 3,579,815 | 5/1971 | Gentry | 29/583 X |
| 3,586,547 | 6/1971 | Glendinning et al. | 156/662 X |
| 3,615,956 | 10/1971 | Irving et al. | 148/1.5 |
| 3,795,557 | 3/1974 | Jacob | 156/662 X |
| 3,852,876 | 12/1974 | Sheldon et al. | 29/583 |
| 4,137,100 | 1/1979 | Zaleckas | 148/187 X |
| 4,256,514 | 3/1981 | Pogge | 148/187 X |
| 4,257,827 | 3/1981 | Schwuttke et al. | 148/187 X |
| 4,274,909 | 3/1980 | Venkataraman et al. | 148/1.5 X |

FOREIGN PATENT DOCUMENTS 55-75232  6/1980  Japan ........................ 29/576 W Primary Examiner—G. Ozaki
Attorney, Agent, or Firm—Robert J. Mooney

[57] ABSTRACT

A method for forming low stress recesses in bodies of semiconductor material involves damaging the body either thermally or mechanically in the area where the recess is to be formed followed by etching in either a plasma or chemical medium to remove the damaged body portion leaving a relatively stress-free slot or other recess. Such recesses are utilized as diffusion sites for rapid formation of diffusion regions through semiconductor wafers and for the subdivision of wafers into discrete devices.

26 Claims, 9 Drawing Figures

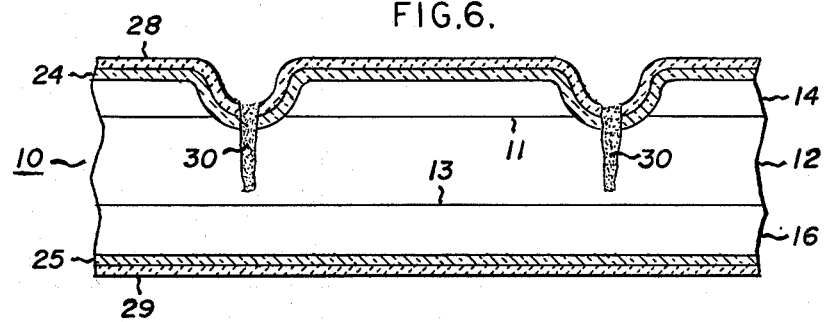
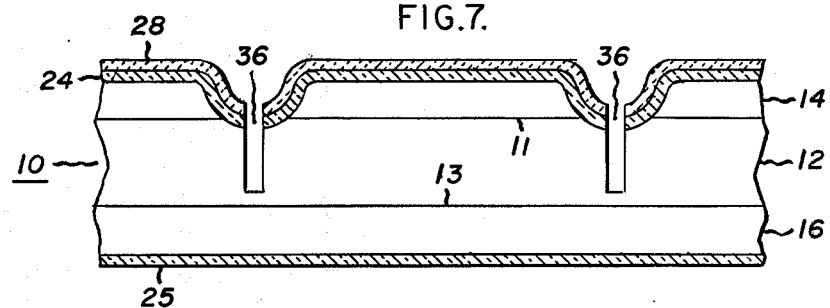
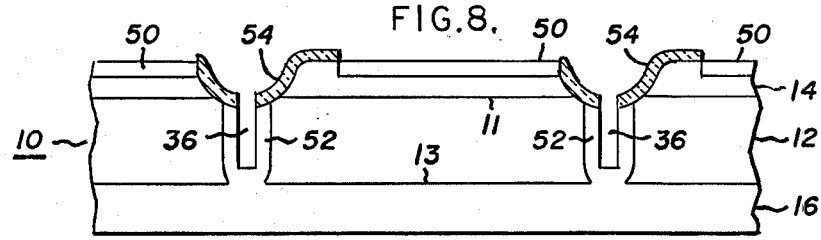
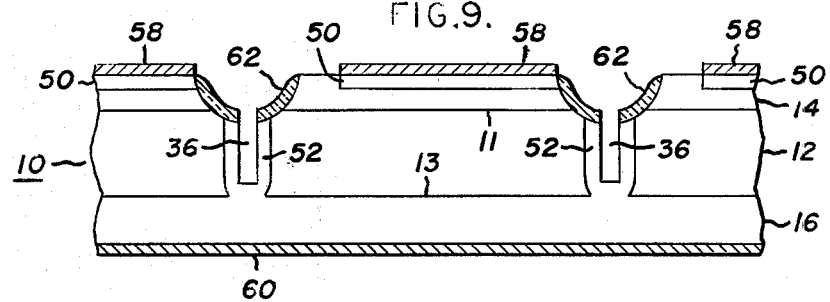

FAST ISOLATION DIFFUSION

This invention relates in general to a method for working silicon in semiconductor devices and more particularly to a method for subdividing semiconductor bodies and for quickly forming a semiconductor region extending through a thick semiconductor body.

It is oftentimes desirable, for many reasons, to be able to form, in a semiconductor body, a region of a particular conductivity type which extends from one surface of the body through the bulk thereof to the other surface. Such regions are commonly employed to isolate semiconductor elements one from the other on a single wafer as well as to terminate a junction in a semiconductor device on a surface where it it easily passivated. Heretofore, several methods have been employed for forming such regions such as diffusion from a source of impurity atoms disposed on one or the other or both surfaces of the body, ion implantation, thermal migration and the like. While each of these methods is effective within its limitations, nevertheless where it is desired to produce a region of the type described through a relatively thick semiconductor body, none is optimum. For example, diffusion from either one or two surfaces of a plate or wafer shaped body from an impurity source deposited on the surface or surfaces of said body is and has for some time been widely employed for forming regions of the type to which this invention is in part addressed. Nevertheless, depending upon the particular impurities selected, the time required for forming such a region is proportional to the thickness of the body and in some cases for particular combinations of semiconductor material and impurity type where the diffusion coefficient is low, substantial time periods are required for such diffusion to take place. In extreme cases where many hundreds of hours would be necessary, the particular combination of impurity and/or silicon material is simply not practically realizable.

Thermal migration offers the potential for substantially reducing the time required for forming impurity regions of the type with which this invention is concerned, however, specialized equipment and techniques are required which may not be available at an acceptable cost.

U.S. Pat. No. 4,137,100 describes one method for forming an isolation region through a relatively thick (0.010") semiconductor wafer of 1.5" to 2.0" dia. The method includes forming an excavation in the semiconductor body using a laser beam, depositing a dopant in the excavation and then diffusing the dopant from the excavation into the semiconductor device. While this method may offer certain advantages in the case of relatively small diameter thick wafers on the order of the sizes described, it suffers from certain disadvantages which essentially prevent its use in modern day processing where substantially large diameter wafers on the order of 3" to 5" or more are employed, even with relatively greater thicknesses. The excavations formed by the laser beam introduce into the semiconductor wafer regions of high stress which substantially reduce the strength of the semiconductor wafer thus inevitably leading to increased breakage of the wafers during subsequent processing, even when extreme care is taken to handle the wafers gently. This increased breakage results in reduced yields of usable devices and, therefore, greatly increases the cost of the process.

In addition to the desirability for quickly forming semiconductor regions extending totally or partially through a semiconductor body, it is further desirable to form grooves, recesses, bevels and the like on semiconductor bodies quickly and without substantially weakening the semiconductor devices. Still further it is desirable to provide means for subdividing semiconductor wafers including a plurality of devices simultaneously formed thereon into discrete devices which may then be separately utilized. These objects have been accomplished in the past through the use of a number of processes such as chemical etching, mechanical abrading and scribing and breaking, for example. Each of these methods for working semiconductor materials has disadvantages which in some way restricts its usefulness. For example, chemical processing especially through the use of wet chemical etches is undesirable inasmuch as waste materials are produced thereby which present certain increasingly burdensome problems in the appropriate disposal thereof. Still further, these materials have a limited life, are difficult to use and may represent certain safety hazards in use which require extensive precautions during use which add to the cost. Mechanical abrading processes such as grit dusting, grit blasting, sawing, grinding and the like produce surfaces which may be undesirable from a residual stress viewpoint in a manner similar to that hereinabove discussed. Still further, these methods are not easy to control to a high degree of precision and may in some cases, introduce environmental hazards which make their use undesirable.

Accordingly, it is an object of this invention to provide a method for forming a deep region of a selected conductivity type in a semiconductor body in a shorter time than would be required for forming the same region by diffusion from the surface of the body.

It is another object of this invention to provide such a semiconductor region in accordance with the process described herein which does not significantly reduce the physical strength of the semiconductor body in which the region is formed.

It is yet another object of this invention to form such a region without the necessity for employing specialized equipment or high cost processes.

It is a further object of this invention to provide a method for forming a recess, groove, bevel or the like in a semiconductor body which does not substantially weaken the body or introduce microcracks or the like therein and which is inexpensive as well as easy to practice.

Briefly stated and in accordance with a presently preferred embodiment of this invention, a semiconductor region of a selected conductivity type is formed in a semiconductor body by damaging the crystal lattice structure of said body, for example, by focusing a laser on the surface of said body to create a damaged region extending from the surface into the body but not completely therethrough. After creation of the damaged region the surface of the body from which the damaged region extends is etched in a reactive plasma to remove laser remelt and damaged silicon thus leaving a groove or slot extending from the surface into but not completely through the body. The inner surface of the slot is relatively low in stress and dislocation density. Where a semiconductor region of a particularly selected conductivity type is desired, a source of impurity atoms is deposited on the surface of the device where the semiconductor region of the desired impurity type is desired to be formed and especially on the inner surface of the groove. The semiconductor body is then placed in a suitable environment for diffusion, the temperature is increased and diffusion occurs from the surface of the slot outward into the body.

In accordance with another aspect of this invention damage to the crystal structure of the semiconductor body prior to plasma etching may be caused by alternative means such as irradiating the area where damage is required with high energy particles such as electrons or ions or protons. Still further, it may be desirable in some instances to form a groove or slot mechanically, as for example, by sawing part way through a wafer. In either case the damage is followed by a plasma etching step for removing the damaged region to create a slot low in stress and relatively free of disclocations.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIGS. 1-9 are section views of a device during various stages of a process in accordance with this invention wherein the several steps thereof are illustrated.

Referring now to FIG. 1, a portion of a three-layer semiconductor body 10 is illustrated including therein two plane junctions 11 and 13. Generally, a plurality of semiconductor devices is simultaneously formed in such a body which is then divided to separate the devices. The formation of such a body may be accomplished by any method known to those skilled in the art such as by diffusion of dopants producing layers 14 and 16 of one conductivity type into a semiconductor wafer of the opposite conductivity type which forms layer 12. Other methods of producing such a structure such as epitaxial growth or the like may equally well be employed in accordance with the teachings of this invention.

Figure 2:
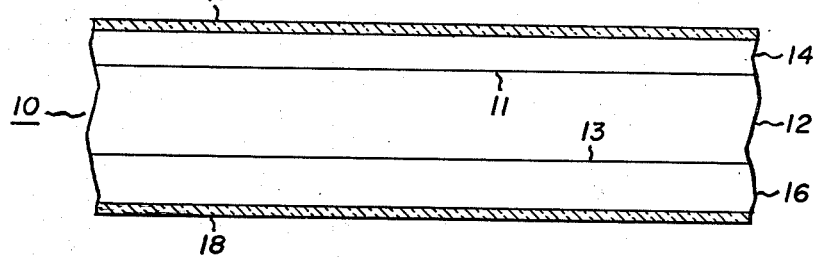

FIG. 2 illustrates the formation of oxide layers 17 and 18 on the top and bottom surfaces of body 10. Where the semiconductor body is silicon, the oxide may conveniently be silicon dioxide, silicon nitride or some other oxide nitride or the like or some combination of two or more oxides, nitrides or the like, the formation of which is also well known to those skilled in the art.

Figure 3:
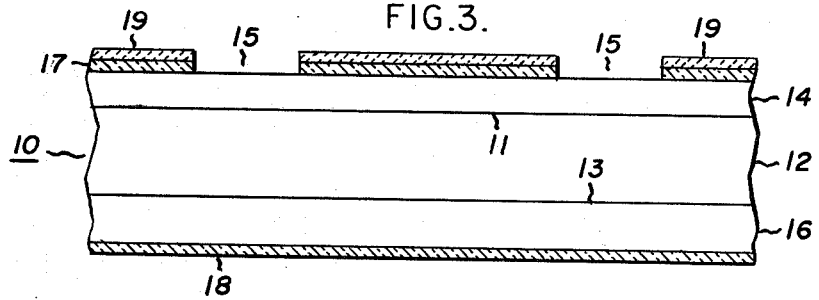

In FIG. 3, the patterning of oxide layer 17, for example, by photolithography, is illustrated wherein the oxide is selectively removed to form an opening 15 which may be an annular opening exposing a portion of the surface of the semiconductor wafer. The selective removal of oxide, for example, by applying a layer of photoresist 19, patterning the photoresist by exposure through a mask or the like developing and etching to remove the undesired oxide region is well known and will not be discussed further herein.

Figure 4:
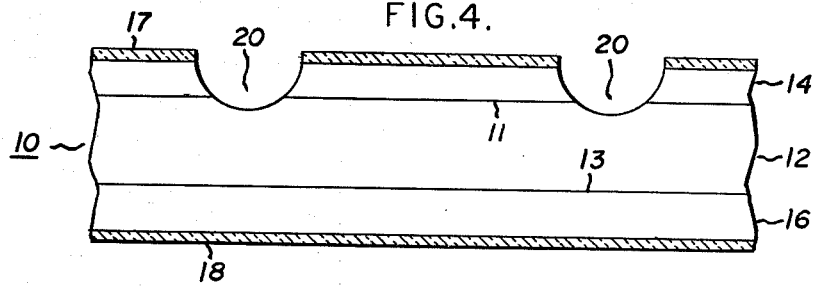

A groove 20, which may be a single peripheral groove as shown in FIG. 4 is now formed by selectively etching semiconductor body 10 through opening 15. Preferably, groove 20 extends through junction 11 between layers 14 and 12 at an angle therewith which may be selected by one skilled in the art by varying the shape and depth of the groove to provide a bevelled surface at the termination thereof which will subsequently be passivated with a glass or other suitable material for providing high breakdown voltage. Any etching solution which will effectively remove the desired amount of semiconductor material from body 10 in an appropriate time may be employed as is apparent to those skilled in the art. Semiconductor body 10 after the formation of groove 20 is illustrated in FIG. 4 which also shows that photoresist layer 19 has been removed during etching. Groove 20 may be one of a number of such grooves formed on the semiconductor wafer for dividing the same into isolated semiconductor elements for later separation and individual use.

Figure 5:
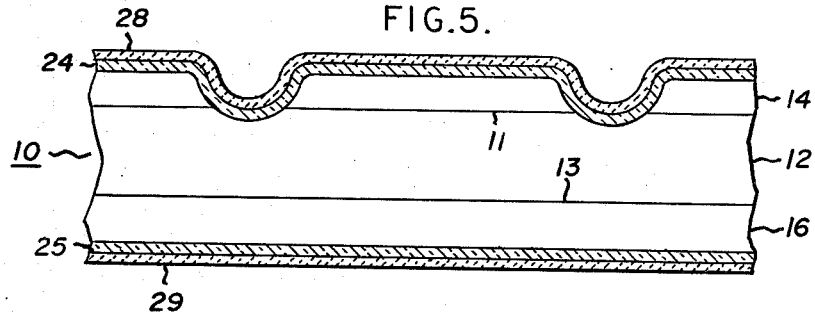

Referring now to FIG. 5, any portion of oxide layer 18 remaining after the etching step of FIG. 4 may be removed and new oxide layer 24 formed on the upper surface and layer 25 formed on the lower surface of the wafer. Where desired, these layers may be formed over any portions of oxide layers 17 and 18 remaining after the formation of groove 20. Upper and lower layers of photoresist 28 and 29 are applied over the oxide and dried.

Referring now to FIG. 6, a damaged region 30 is formed preferably by directing a laser beam at the surface of the device for example, in the bottom of groove 20. In accordance with an exemplary embodiment of this invention a YAG laser having a maximum output of about $\frac{1}{2}$ joule per centimeter squared is employed. Such a laser may advantageously be operated in a pulse mode at a repetition rate of about 8 kilohertz and a scanning speed of about 4" per second. A wave length of 1060 nanometers at a divergence of 1.5 nanometers is preferred.

Contrary to the teachings of the prior art it has been found neither necessary nor desirable in accordance with this invention to remove any substantial amount of semiconductor material with the laser but rather to create a region wherein substantial damage to the silicon lattice is created without the removal of appreciable material. Preferably laser damage should be constrained to the upper 90% of the thickness of layer 12. This will, nevertheless, allow subsequent etching and diffusion steps to reach layer 16 while not unnecessarily weakening the semiconductor device. It has been found in accordance with this invention that immediately following the laser damage step the semiconductor wafer is in somewhat weakened condition and should be handled with care to prevent fracture.

Following the formation of damaged region 30, the device is etched in a plasma to form slot 36 shown in FIG. 7. Either barrel or planar plasma reactors utilizing HCl or HBr gases may be employed. It has been discovered that a reactive plasma including a combination of about 96% $CF_4$ and 4% $O_2$ gases provides satisfactory etching. It has been further found that during the plasma etching portion of a process in accordance with this invention the etch rate is relatively high during the time that the semiconductor material damaged by the laser beam is being removed and thereafter slows substantially so that the etching step is particularly easy to control. Therefore, the etching time need not be particularly accurately conrolled since the rate of removal of the undamaged semiconductor material after the completion of the removal of damaged material is not great. Typically, at a pressure of between about $\frac{1}{2}$ and 1 Torr at a power level of about 400 watts, times on the order of one hour or less, depending upon the depth of slot desired, may be used for the etching step with favorable results. It has been discovered that a slot extending about 95% of the way through layer 12 provides satisfactory results.

It was heretofore pointed out that immediately following the laser damage step in accordance with this invention, the strength of a semiconductor wafer is decreased somewhat. Surprisingly, after plasma etching the strength of the semiconductor wafer unexpectedly increases and the particular care in handling which is required both immediately following laser damage in accordance with the present invention and throughout the later stages of processing in accordance with the methods of the prior art is unnecessary. Even though the thickness of the wafers in the areas of the plasma etched grooves is distinctly reduced, the strength of the wafer is not reduced to anywhere near the extent which would heretofore have been expected and, therefore, premature breakage of the wafer during subsequent processing is not experienced to anywhere near the degree heretofore encountered.

Where the process of this invention is utilized solely to form groove 36 and not for the subsequent diffusion processes hereinbelow described, the processing of the wafer may conclude at this point. While the invention has been illustrated in accordance with a particular embodiment thereof wherein a slot is formed, it will be understood that other configurations may equally well be formed, for example, slots of other shapes including v-shaped slots, inverse v-shaped slots, square slots, bevels and the like which shape may be relatively easily formed in accordance with this invention due to the high degree of controllability of a laser and the accompanying flexibility thereof for forming the damaged region prior to plasma etch. Shapes which heretofore have been formable only with great difficulty if at all, may be relatively routinely formed through the use of this invention. For example, inverse v-shaped slots having a greater width at the bottom thereof than at the top may be relatively easily formed in accordance with this invention as compared to the extreme difficulty of forming such structures in accordance with the prior art.

Where it is desired to pelletize, that is to say to completely separate a wafer into a plurality of discrete devices in accordance with this invention, it is preferable that slot 36 of FIG. 7 be extended even further into wafer 10 so that upon the completion of plasma etching the wafer is completely or nearly completely subdivided by the slot. Where the subdivision of wafers into pellets is desired, it is particularly advantageous to use an electron beam to form damaged region 30. It is poined out that even where damaged region 30 extends completely through wafer 10, the wafer, nevertheless maintains sufficient mechanical strength so that it may be processed in the plasma reactor as a single unit and only after the completion of said plasma etching step is the subdividion of the wafer into individual pellets accomplished. Such individual pellets exhibit a superior peripheral edge insofar as stress and the presence of microcracks are concerned. Specifically, stress is exceedingly low and microcracks are virtually if not entirely eliminated.

After the plasma etching step followed by stripping of the photoresist layer and underlying oxide layer, further diffusion may be accomplished if desired as shown in FIG. 8. In accordance with a presently preferred embodiment of this invention a source of doping material is applied on the surface of the device within slot 36. Where the formation of further regions in other portions of the semiconductor device as illustrated, for example, by emitter regions 50 of the device shown in FIG. 8 is desired, doping sources for the impurities required to form those regions may also be applied by conventional means. In FIG. 8 a four-layer semiconductor device, as for example, a thyristor is shown wherein regions 12, 14, and 16 are formed as hereinabove described, and additional regions 50 are formed, for example, from a source of impurity atoms deposited on the surface of the device and then heated to a temperature sufficient to cause diffusion into the semiconductor body. Oxide layer 54 acts as a mask for the formation of regions 50 as is well known. Simultaneously, isolation region 52 may be formed from the source of impurity atoms on the inside surface of groove 36 by diffusing that impurity into the body of the device either simultaneously with or independently from the formation of regions 50. The use of groove 36 as hereinabove described makes possible the formation of the isolation region along with the n-conductivity type emitter region in substantially the same amount of time as compared to the substantially longer time usually required for forming deep isolation regions.

While the invention has been described in conjunction with an embodiment thereof which includes a groove at the surface of which at least one junction terminates and from the bottom of which a slot extends for forming an isolation diffusion extending through the wafer, it is not necessary that the slot extend from the bottom of the groove into the wafer. For example, it is within the scope of this invention to form a slot from a surface of a semiconductor body into the body and to separately form a passivating groove within the boundaries of the device. As a further example, where a groove is not desired at all, the slot and isolation diffusion may still be formed as hereinabove described, the combination of the groove and slot extending into the body therefrom being only a particularly advantageous structure in certain cases.

FIG. 9 illustrates a substantially completed device in accordance with an exemplary embodiment of this invention which includes contact metallization regions 58 on the emitters 50 of the several semiconductor devices and metallization 60 on the lower surface of the device. Further, glass or other passivating material 62 is deposited on the inner surface of groove 20 for passivating both the junction between layers 14 and 12 and the junction between layer 12 and region 52. The device shown in FIG. 9 may be pelletized by breaking, cutting or otherwise dividing the wafer through slot 40 according to any convenient method and subsequently packaging the individual devices as is well known to those skilled in the art for such devices. The pelletizing technique should recognize the exceptional strength of wafers and their lack of propensity to break along the slot as might be expected.

In accordance with an exemplary embodiment of this invention an n-conductivity type wafer having a resistivity in the range of 20 to 50 ohms centimeters is diffused from each surface thereof to a depth of about 1.8 mils with acceptor generating impurities to form p-type surface layers. The oxide layer which forms during diffusion is photoresist patterned and a groove is formed by conventional means extending at least through one of the p-conductivity type layers into the n-conductivity type portion of the substrate, such a groove having a width of about 20 mils and a depth of about 2 to 3 mils. A new layer of photoresist is deposited on the wafer at least in the groove and a laser damaged region is created from the bottom of the groove under the conditions hereinabove set forth extending into the wafer a total depth of about 6 mils. measured from the upper surface of the wafer. This depth is selected to result in a slot, after plasma etching, extending close to but not touching the lower p-conductivity type layer. It is preferred that the depth of the slot be selected so that diffusion of a region extending to the lower p-conductivity type layer from an impurity deposited on the inner walls of the slot may be accomplished in approximately the same time as is required to form the cathode region by diffusion. The laser damaged wafer is then etched in a plasma reactor according to the method hereinabove described thereby producing a relatively stress-free slot having a width of about ½mil and a depth of about 4 mils. At this stage the relative fragility of the wafer is substantially reduced and ordinary handling precautions are adequate to reduce the risk of breakage to an acceptable amount.

After the slot has been plasma etched, the photoresist layer is removed and boron predeposition in the slot is performed. The wafer is oxidized, patterned, and phosphorus is deposited to form a source for n-conductivity type cathode regions. The boron and phosphorus diffusions are carried out simultaneously and followed, if desired, by phosphorus gettering from the surface. An oxide layer is grown and patterned and selective glass passivation of the two junctions terminating on the inner surface of the groove is performed. The device is then metallized to form contacts and pelletized according to well known techniques.

The pelletizing technique used must be selected with regard to the fact that wafers formed in accordance with this invention do not exhibit the same tendency to break along the slot as do wafers formed in accordance with prior art methods as exemplified by the U.S. Pat. No. 4,137,100. Accordingly, methods for pelletizing wafers without slots may be appropriately employed such as mechanical or laser scribing the lower surface of the wafer and breaking the wafer along the scribe line.

This invention may be equally advantageously practiced using intersecting parallel isolation regions to define a plurality of devices on a wafer as well as with non-intersecting moat structures surrounding the undivided devices. It is presently preferred to use the moat structure to isolate the individual devices on the wafer.

While this invention has been described in connection with a particular device and in accordance with a presently preferred embodiment thereof, those skilled in the art will recognize that certain modifications and changes may be made without departing from the true spirit and scope of the invention.

For instance, while it is preferred to generate the damaged region in the wafer by laser melting, other instrumentalities such as electron beams or ion beams or the like may be employed to form the damaged regions. The essential steps include formation of the damaged regions and etching of that region to produce a low stress slot and to remove the damaged material therefrom.

While the invention has been described using a continuous slot as a site from which the isolation diffusion is made, the invention also contemplates forming a line of relatively closely spaced but isolated columnar damaged regions which may then be etched in the same way as a continuous groove shaped damaged region to form a line of isolated columnar holes extending into or through the wafer. The spacing between the columnar regions is selected so that lateral diffusion distances of at least one half the spacing are achieved in the same or less time as the vertical diffusion from the bottom of the regions to the lower layer. Even greater wafer strength than is achieved with a slotted structure can be achieved. Accordingly, the invention as well as all modifications and changes as fairly fall within the true scope thereof are intended to be defined solely in the appended claims.

What is claimed is:

1. A method for forming a low residual stress recess in a body of semiconductor material comprising:
   selectively damaging the semiconductor body at the location of the recess to be formed, said damaging step producing a localized relatively high residual stress at the location of said recess, and
   dry etching said body at least in said damaged region to remove substantially all of the damaged material thereby providing said low residual stress recess in said body.

2. The method of claim 1 wherein said dry etching step comprises selectively etching said body to remove said damaged material at a greater rate than the undamaged material.

3. The method of claim 2 wherein said dry etching step comprises etching the body in a plasma.

4. The method of claim 3 wherein etching said body in a plasma comprises etching said body in a reactive plasma.

5. The method of claim 4 wherein said plasma comprises a plasma including $CF_4$ as a major constituent.

6. The method of claim 5 wherein said plasma also includes oxygen.

7. The method of claim 1 wherein said dry etching step comprises etching in a gaseous environment.

8. The method of claim 7 wherein said etching step comprises etching in a gas selected from the group including HCl and HBr as major constituents.

9. The method of claim 1, 2, 3, 4, 5, 6, 7 or 8 wherein selectively damaging said body comprises mechanically damaging said body.

10. The method of claim 1, 2, 3, 4, 5, 6, 7 or 8 wherein selectively damaging said body comprises mechanically damaging said body by directing a stream of high energy particles at said body whereby said damage results from collisions between said particles and said body.

11. The method of claim 1, 2, 3, 4, 5, 6, 7 or 8 wherein said selectively damaging step comprises damaging said body by directing a stream of high energy particles selected from the group consisting of electrons and ions at said body whereby said damage occurs by collisions between said particles and said body.

12. The method of claim 1, 2, 3, 4, 5, 6, 7 or 8 wherein said damaging step comprises damaging said semiconductor body without removing any substantial amount of material from the locus of the damage.

13. The method of claim 1, 2, 3, 4, 5, 6, 7 or 8 wherein damaging said body comprises locally heating said body to melt a small portion thereof.

14. The method of claim 1, 2, 3, 4, 5, 6, 7 or 8 wherein damaging said body comprises heating said body by directing a laser beam at a selected portion of said body to melt said portion.

15. The method of claim 1, 2, 3, 4, 5, 6, 7 or 8 wherein said damaging step comprises directing a laser beam at said body and scanning said beam to essentially cover said location of said recess.

16. The method of claim 1, 2, 3, 4, 5, 6, 7 or 8 wherein damaging said body comprises directing a laser beam at a plurality of discrete spaced apart damage sites within the area to be damaged thereby melting said body at said discrete spaced apart damage sites.

17. A method for forming a region of a first conductivity type at least partially through a region of a second conductivity type comprising selectively damaging the crystal structure of said region of said second conductivity type to a depth less than the thickness of the region; and dry etching said damaged region to remove the damaged material leaving a relatively stress free slot extending less than completely through the region; and depositing a source of impurity atoms on the inner surface of said slot and diffusing said impurity through said region of said second conductivity type from said slot.

18. A method for forming a plurality of semiconductor devices on a single semiconductor wafer comprising providing a semiconductor wafer of layered construction including at least three alternating zones of different conductivity type forming first and second junctions therebetween;

forming an annular groove in a first surface of said semiconductor body intersecting the upper one of said junctions, said groove surrounding the active portion of at least one of said devices;

selectively damaging said body to a depth at least approaching said second junction;

dry etching said semiconductor body to remove damaged material to provide a low stress slot extending at least partially through the semiconductor region between said first and second junctions;

providing a source of impurities on the inner surface of said slot and diffusing said impurities into said body at least a distance sufficient to cause the region created by said diffusion to extend to said second junction whereby said second junction terminates at said groove;

passivating both said first and second junctions by applying a layer of passivating material to the inner surface of said groove; and dividing said semiconductor wafer into a plurality of individual devices, through said slot.

19. The method of claim 18 wherein said damaging comprises damaging the semiconductor body without removing any substantial amount of material from the body during the damaging step.

20. The method of claim 19 wherein damaging said body comprises selectively directing a stream of ions at said body thereby damaging the crystal lattice.

21. The process of claim 18 wherein damaging said body comprises locally heating said body to melt a small portion of the body.

22. The method of claim 21 wherein heating said body comprises heating said body by directing a laser beam at a selected portion of said body.

23. The process of claim 22 wherein said damaging step comprises directing a laser beam at said body and scanning said beam to create a continuous damaged path in said body.

24. The method of claim 22 wherein damaging said body comprises directing a laser beam at a plurality of discrete, spaced apart damage sites.

25. The method of claim 21 wherein heating said body comprises directing an electron beam at selected portions of said body to locally damage the crystal structure thereof.

26. A method for forming a region of a first conductivity type through a body of a second conductivity type comprising selectively damaging the crystal structure of said body to a depth less than the thickness of the body; and etching said body to remove the damaged material leaving a relatively stress free slot extending less than completely through the body; and depositing a source of impurity atoms on the inner surface of said slot and diffusing said impurity into said semiconductor body from said slot.

* * * * *